(12) United States Patent
Lee et al.

(10) Patent No.: US 6,304,229 B1
(45) Date of Patent: Oct. 16, 2001

(54) ELECTROMAGNETIC WAVE DETECTING DEVICE INCORPORATING THEREIN A THERMOCOUPLE

(75) Inventors: Dae Sung Lee; Se Hong Chang, both of Kyunggi-Do; Kyoung Il Lee, Seoul; Sang Mo Shin, Kyunggi-Do, all of (KR)

(73) Assignee: Korea Electronics Technology Institute, Kyunggi-Do (KR)

( * ) Notice: Subject to any disclaimer, the term of this patent is extended or adjusted under 35 U.S.C. 154(b) by 0 days.

(21) Appl. No.: 09/614,278

(22) Filed: Jul. 12, 2000

(30) Foreign Application Priority Data

Sep. 30, 1999 (KR) .................................................. 99-41939

(51) Int. Cl.[7] .................................................. G01R 21/04
(52) U.S. Cl. ............................................. 343/795; 343/703
(58) Field of Search ........................... 343/795, 700 MS, 343/703; 324/95

(56) References Cited

U.S. PATENT DOCUMENTS 3,750,017 * 7/1973 Bowman et al. ....................... 324/72
3,794,914 * 2/1974 Aslan ..................................... 324/95

* cited by examiner

*Primary Examiner*—Don Wong
*Assistant Examiner*—Jamos Clinger
(74) *Attorney, Agent, or Firm*—Rosenman & Colin, LLP.

(57) ABSTRACT

An electromagnetic wave detecting device includes a dipole antenna having a pair of disjointed arms for receiving an electromagnetic wave and a thermocouple having a first and a second leg of two dissimilar conductors, for detecting the electromagnetic wave received by the arms of the antenna.

17 Claims, 6 Drawing Sheets

ELECTROMAGNETIC WAVE DETECTING DEVICE INCORPORATING THEREIN A THERMOCOUPLE

FIELD OF THE INVENTION

The present invention relates to an electromagnetic wave detecting device; and more particularly, an electromagnetic wave detecting device incorporating therein one or more thermocouples.

BACKGROUND OF THE INVENTION

There is shown in FIG. 1 a conventional electromagnetic wave detecting device 1 including a half-wave dipole antenna 3 and a rectifying diode 5. In the electromagnetic wave detecting device, an electromagnetic wave is detected by the rectifying diode 5 converting a radio frequency signal to an electrical signal when the half-wave dipole antenna 3 receives an electromagnetic wave.

In such an electromagnetic wave detecting device, it is difficult to manufacture a nonlinear element such as a diode capable of operating in a frequency range greater than the millimeter wave frequency regime (30–300 GHz).

There is shown in FIG. 2 another conventional electromagnetic wave detecting device 2 for use in a frequency range greater than millimeter waves.

As shown, the electromagnetic wave detecting device 2 includes a half-wave dipole antenna having a pair of arms 12a, 12b for receiving an electromagnetic wave power, a heating element or a heater 13 disposed between the arms 12a, 12b of the dipole antenna, for converting the radiant energy received by the arms 12a, 12b to the thermal energy, a thermal sensor 15 for sensing the temperature changes of the heater 13, a pair of terminals 17 for measuring the changes in resistance of the thermal sensor 15, and a pair of signal lines 16 for coupling the thermal sensor 15 and the terminals 17.

The thermal sensor 15 is conventionally made of a temperature sensitive material, such as vanadium oxide ($VO_2$), having a large TCR (temperature coefficient of resistance).

However, such a temperature sensitive material, e.g., $VO_2$, requires a heat treatment at higher than, e.g., 500° C., which is not compatible with a CMOS (complementary metal-oxide-semiconductor) process used in forming driving circuitry (not shown) of the electromagnetic wave detecting device. As a result, the detecting device and the driving circuitry may not be fabricated simultaneously in a process, requiring additional fabrication process.

SUMMARY OF THE INVENTION

It is, therefore, a primary object of the present invention to provide an electromagnetic wave detecting device capable operating in the frequency range greater than millimeter waves and incorporating therein at least one of thermocouples capable being manufactured during the forming of the CMOS circuit.

In accordance with one aspect of the present invention, there is provided an electromagnetic wave detecting device comprising a dipole antenna having a pair of disjointed arms for receiving an electromagnetic wave, and a thermocouple having a first and a second leg of two dissimilar conductors, for detecting the electromagnetic wave received by the arms of the antenna.

BRIEF DESCRIPTION OF THE DRAWINGS

The above and other objects and features of the present invention will become apparent from the following description of the preferred embodiments given in conjunction with the accompanying drawings, wherein.

DETAILED DESCRIPTION OF THE PREFERRED EMBODIMENTS

Figure 1:
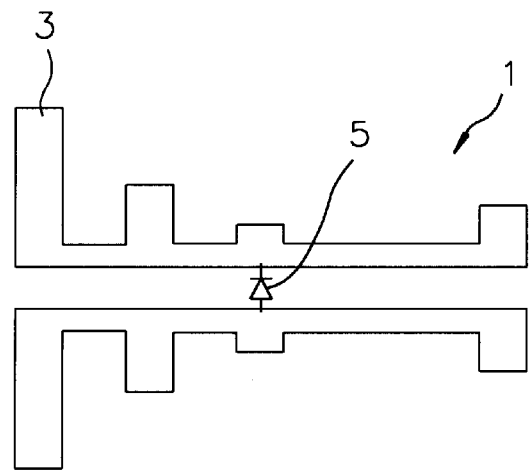
FIG. 1 shows a top plan view of a conventional electromagnetic wave detecting device.
Figure 2:
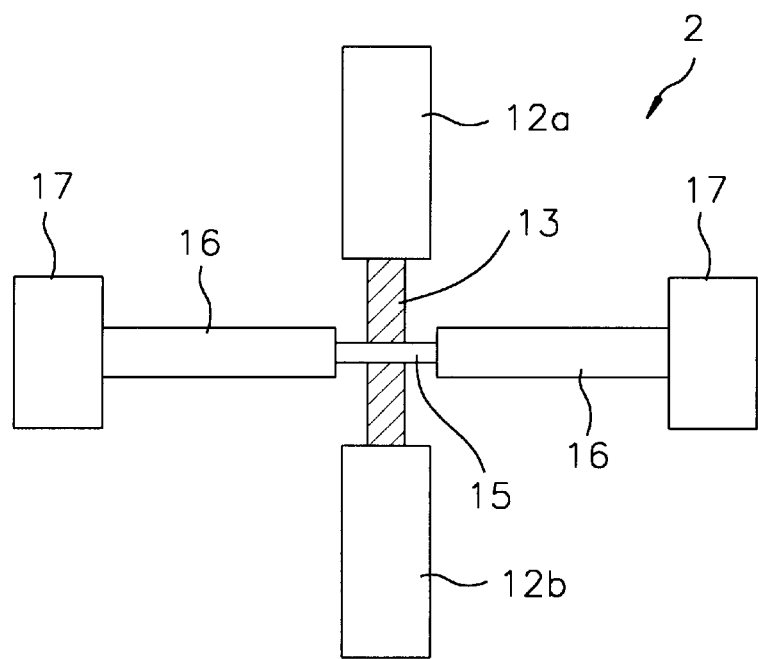
FIG. 2 describes another conventional electromagnetic wave detecting device.

Electromagnetic wave detecting devices in accordance with preferred embodiments of the present invention will be described with reference to FIGS. 3 to 8. It should be noted that like parts appearing in FIGS. 3 to 8 are represented by like reference numerals.

Figure 3:
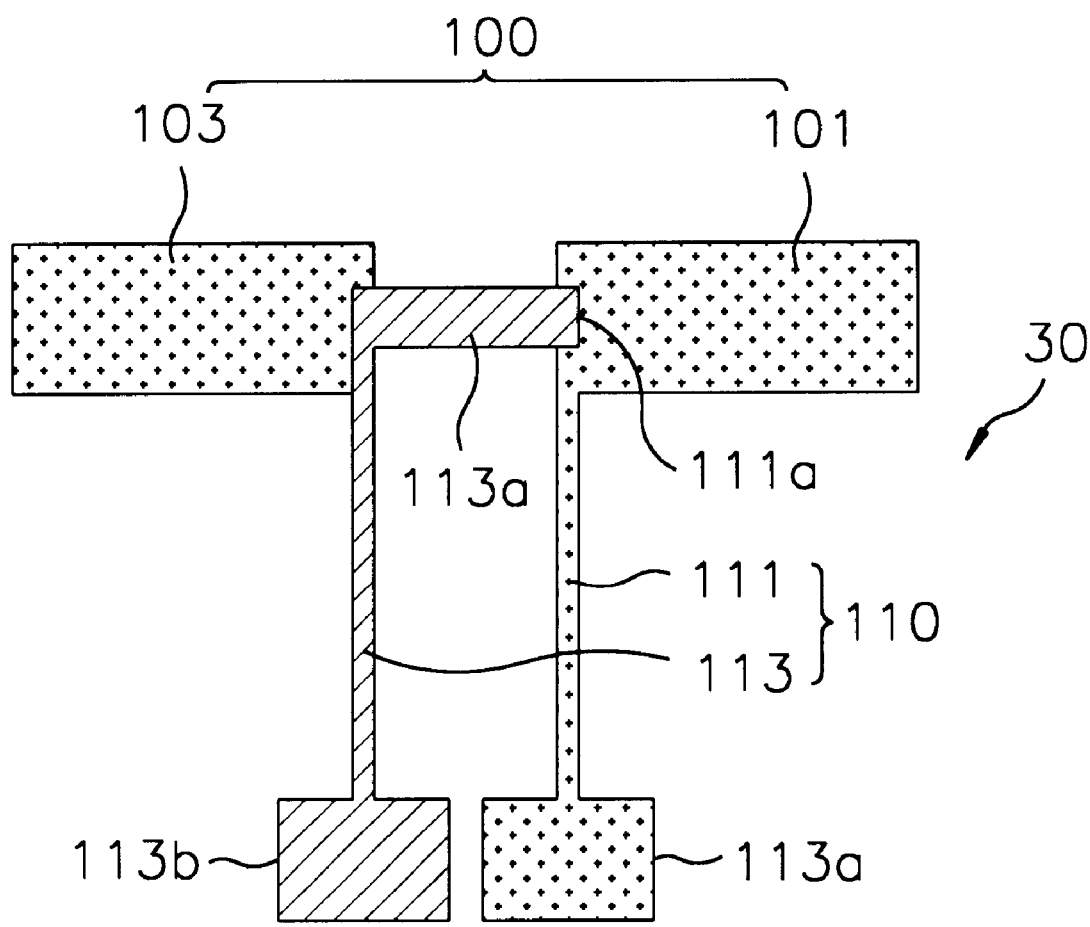
FIG. 3 illustrates a top plan view of an electromagnetic wave detecting device in accordance with a first preferred embodiment of the present invention.

There is shown in FIG. 3 an electromagnetic wave detecting device 30 in accordance with a first preferred embodiment of the present invention.

As shown, the electromagnetic wave detecting device 30 includes a dipole antenna 100 having a pair of disjointed arms 101, 103 and a thermocouple 110 having two legs 111, 113 of two dissimilar conductors. The leg 111 extends from one of the arms 101. One of the end portions of the leg 113 is a connecting portion 113a for connecting the separated arms 101, 103. The connecting portion 113a of the leg 113 functions as a heat source generating the thermal energy in response to the radiation energy or the electromagnetic wave power received by the arms 101, 103 of the antenna 100. The legs 111, 113 are formed to be slender enough to provide a high impedance for impedance matching.

A junction of the thermocouple 110 is formed at a junction portion 111a at which the connecting portion 111a overlaps with an end portion of the arm 101.

When the arms 101, 103 of the antenna 100 receive the electromagnetic wave power, the connecting portion 113a of the leg 113 is heated, causing the temperature of the junction point 111a of the thermocouple 110 to change. The temperature change of the junction portion 111a, in turn, develops an electromotive force in the thermocouple 110 by the thermoelectric effect, to thereby generate a DC voltage on pads 111b and 113b connected to the legs 111 and 113, allowing a corresponding electromagnetic wave to be detected by a CMOS circuit (not shown) connected to the pads 111b and 113b.

In the preferred embodiments of the present invention, electromagnetic wave detecting devices are preferably fabricated by using a thin film process on an insulating layer formed on a semiconductor, e.g., Si, substrate. Further, the electromagnetic wave detecting devices can be fabricated simultaneously together with their control circuits formed by using conventional CMOS process, as will be described in detail hereafter.

Referring back to FIG. 3, the arms 101, 103 and the leg 111 are preferably made of an identical material; and the leg 113 and the connecting portion 113a are made of another identical material. It is also preferable that the arms 101, 103 and the leg 111 are made of a material having a relatively small resistivity e.g., aluminum, to reduce the conduction loss. The leg 113 including the connecting portion 113a is preferably made of p$^+$ polysilicon. Other sets of materials, e.g., p$^+$ polysilicon and n$^+$ polysilicon, Ni and Al, which are capable of being easily treated in CMOS process, can be used in fabricating the electromagnetic wave detecting devices of the invention. This allows the processes of forming the antenna and the thermocouple and the process of forming the CMOS circuit to be carried out simultaneously.

Figure 4A:
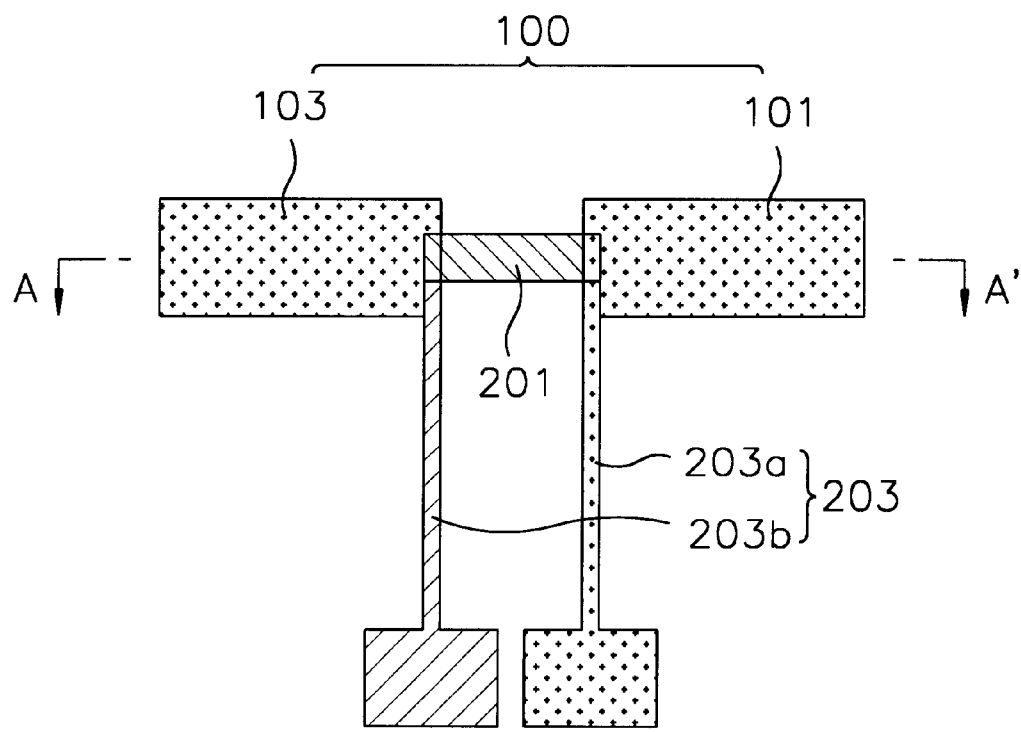
FIGS. 4A and 4B offer a top plan view of an electromagnetic wave detecting device in accordance with a second preferred embodiment of the present invention and a cross sectional view taken along line A–A' of FIG. 4A, respectively.
Figure 4B:
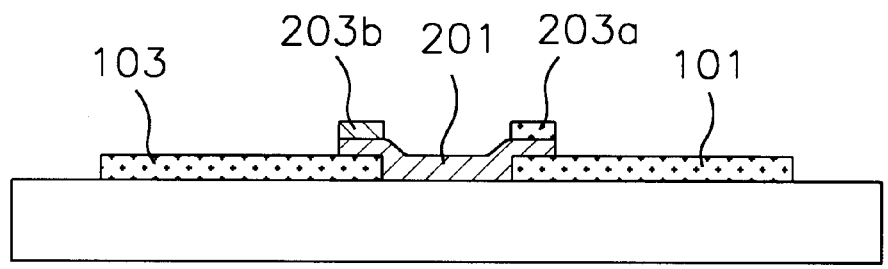

Referring to FIGS. 4A and 4B, there are shown a top plan view and a cross sectional view of an electromagnetic wave detecting device in accordance with a second preferred embodiment of the present invention.

This embodiment is similar to the first one shown in FIG. 3, excepting that the connecting portion 113a is replaced with a resistor 201 and legs 203a and 203b of a thermocouple 203 are in contact with each other through the resistor 201. In this embodiment, the legs 203a, 203b of the thermocouple 203 are not in direct contact with the arms 101, 103; and, therefore, the leg 203a and the arm 101 may not be formed of an identical material. For instance, the arms 101 and 103 may be formed of Al to reduce conduction loss and the legs 203a and 203b may be formed of any set of p$^+$ polysilicon and n$^+$ polysilicon, Al and p$^+$ polysilicon, or Ni and Al. The resistor 201 functions as a heat source and made of, e.g., NiCr. This embodiment is suitable for a case in which resistivities of the two materials constituting the thermocouple 203 are not suitable for impedance matching between the antenna 100 and the thermocouple 203. The legs 203a, 203b of the thermocouple 203 may be formed to be in direct contact with each other on the resistor 201.

Figure 5A:
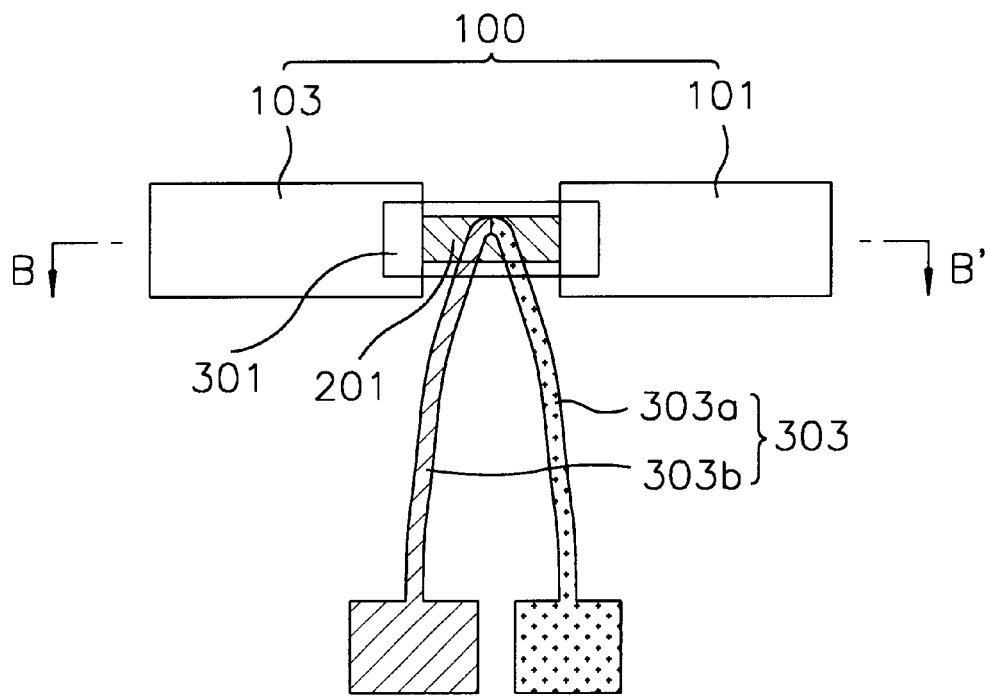
FIGS. 5A and 5B disclose a top plan view of an electromagnetic wave detecting device in accordance with a third preferred embodiment of the present invention and a cross sectional view taken along ling B–B' of FIG. 5A, respectively.
Figure 5B:
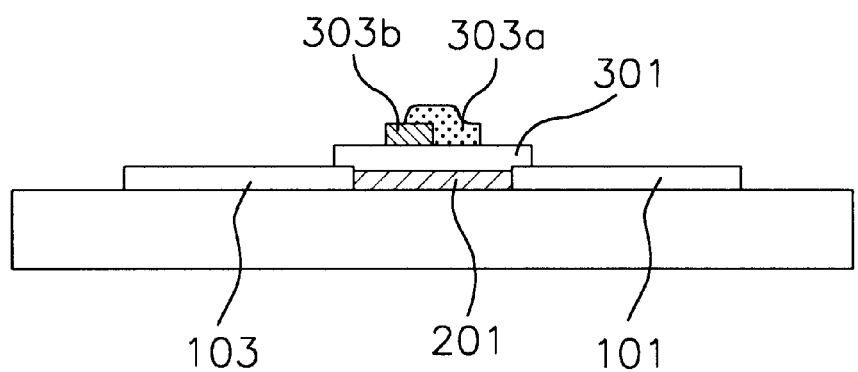

There are shown in FIGS. 5A and 5B a top plan view and a cross sectional view of an electromagnetic wave detecting device in accordance with a third preferred embodiment of the present invention.

The electromagnetic wave detecting device includes an insulating layer 301 formed on the resistor 201. This arrangement reduces a thermal loss of the resistor 201. The electromagnetic wave detecting device further includes a thermocouple 303 composed of two legs 303a, 303b of two dissimilar conductors.

The junction of the thermocouple 303 is formed on top of the insulating layer 301 above the resistor 201 by the direct contact of the legs 303a, 303b. The insulating layer 301 may be formed only on a region on which the junction of the thermocouple 303 resides or on a region covering the arms 101, 103 and the resistor 201.

Figure 6:
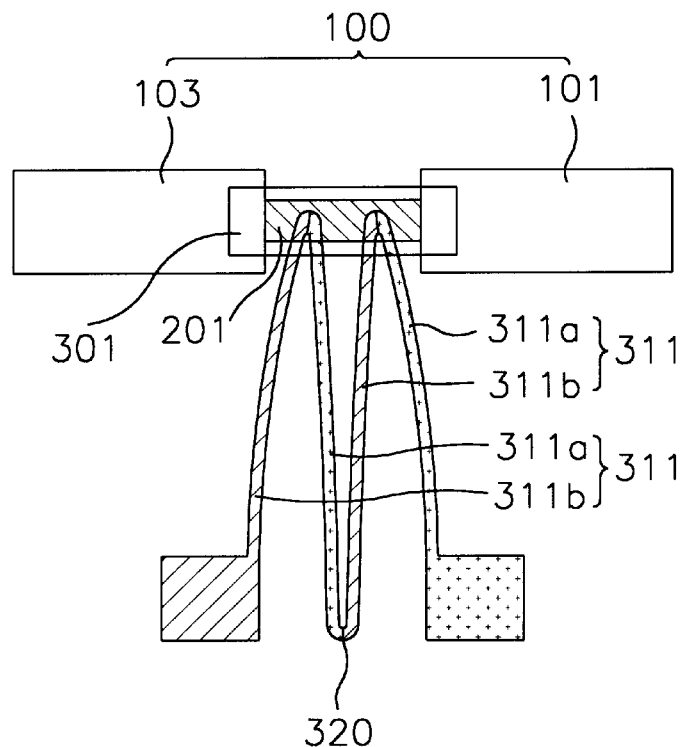
FIG. 6 presents a top plan view of an electromagnetic wave detecting device in accordance with a modified embodiment of the third preferred embodiment.

Such an arrangement is suitable for an electromagnetic wave detecting device requiring a high sensitivity since multiple direct junctions of thermocouples can be placed on the resistor. For example, there is shown in FIG. 6, a plurality of junctions (only two are shown) of thermocouples 311, each thermocouple being made of two legs 311a, 311b of two dissimilar conductors directly joined together on the insulating layer 301 above the resistor 201, the two thermocouples 311 being connected in series through another junction 320 formed by the legs 311a, 311b outside the resistor region. In such an arrangement, multiple junction points of the thermocouples can be placed above the resistor. Accordingly, the sensitivity of the electromagnetic wave detecting device can be increased.

Figure 7:
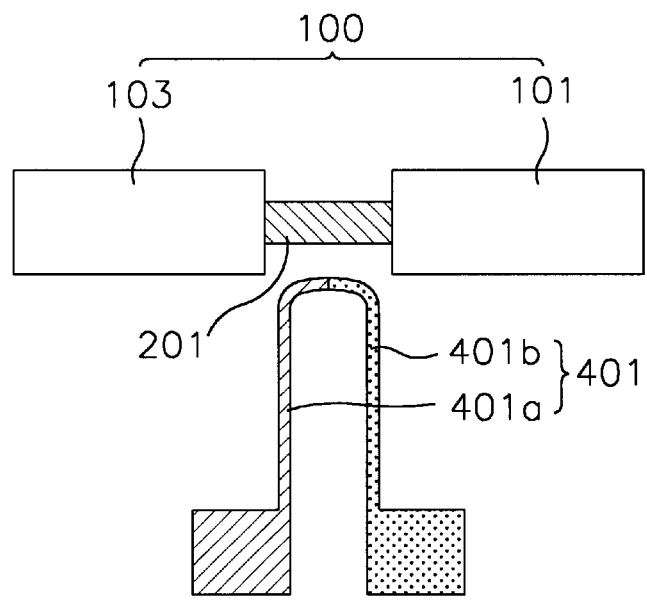
FIG. 7 depicts a top plan view of an electromagnetic wave detecting device in accordance with a fourth preferred embodiment of the present invention.

There is shown in FIG. 7 a top plan view of an electromagnetic wave detecting device in accordance with a fourth preferred embodiment of the present invention.

This embodiment is similar to the third one excepting that a junction of a thermocouple 401 is formed by the direct contact of two legs 401a, 401b in the close vicinity of the resistor 201 on an identical plane and there exits no insulator layer on the resistor 201. In such an electromagnetic wave detecting device, it is possible to form the antenna 100, the resistor 201 and the thermocouple 401 on the identical surface level of a substrate and omit the insulating layer deposition process, allowing the electromagnetic wave detecting device to be manufactured with a reduced complexity.

Figure 8:
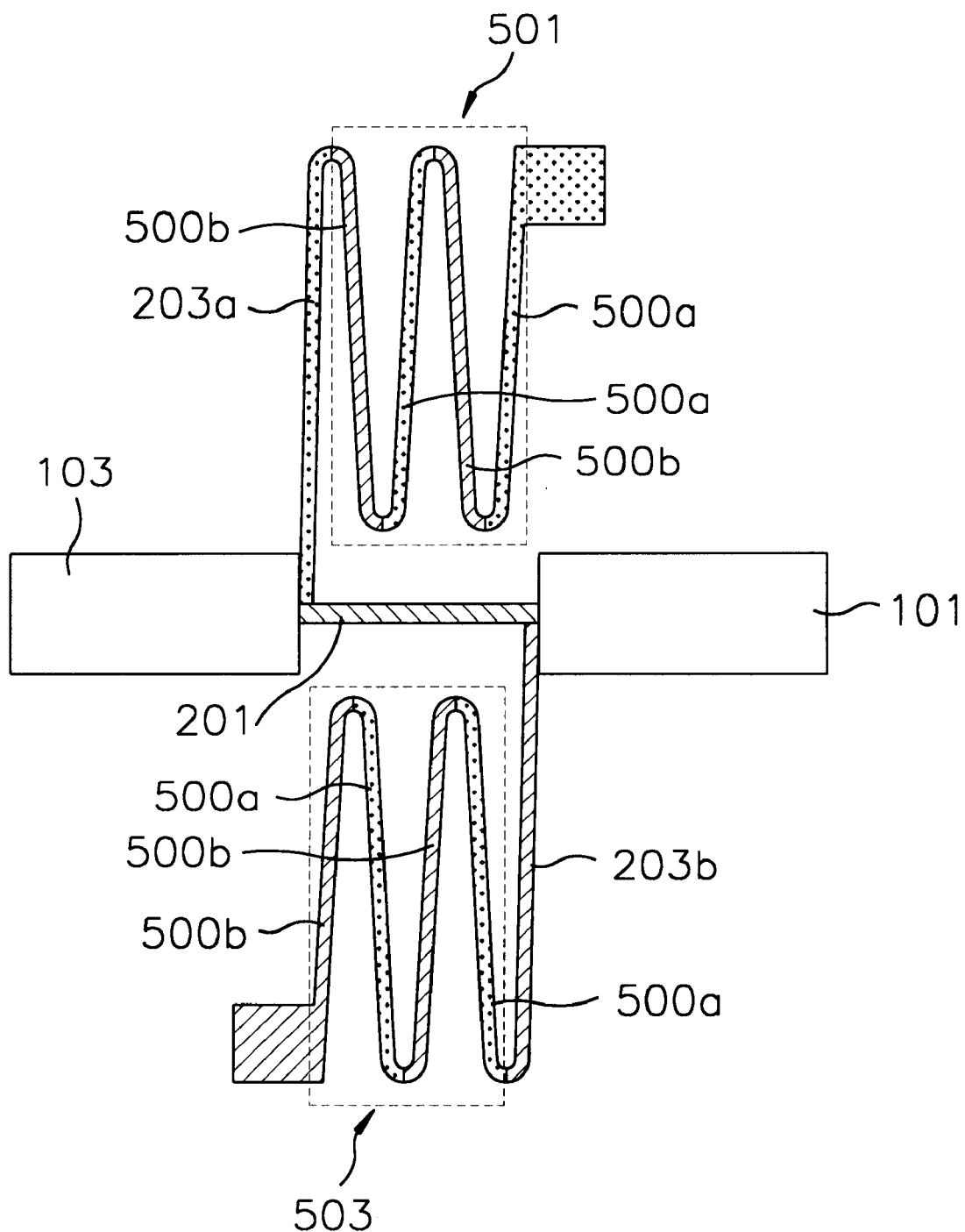
FIG. 8 is a top plan view of an electromagnetic wave detecting device in accordance with a fifth embodiment of the present invention.

There is shown in FIG. 8 a top plan view of an electromagnetic wave detecting device in accordance with a fifth embodiment of the present invention.

This embodiment is similar to the second one excepting that a pair of thermocouple groups 501, 503, each group having at least one thermocouple (two are shown) are connected to the legs 203a, 203b shown in FIG. 4A. The thermocouples in a group are connected to each other in series through the dissimilar conductors. The respective thermocouples of the groups 501, 503 are composed of a pair of legs 500a, 500b made of an identical set of materials used in forming the legs 203a, 203b in FIG. 4A. The resistor or heat source 201 may be made of an identical material used in forming one of the legs 203a, 203b. A junction of each thermocouple in groups 501, 503 is located in the vicinity of the resistor 201, allowing the output power of the electromagnetic wave detecting device to increase.

While the present invention has been described with respect to certain preferred embodiments only, other modifications and variations may be made without departing from the scope of the present invention as set forth in the following claims.

What is claimed is:

1. An electromagnetic wave detecting device, comprising:
   a dipole antenna having a pair of disjointed arms for receiving an electromagnetic wave;
   a heat source connecting the arms of the dipole antenna for generating thermal energy in response to the electromagnetic wave received by the arms of the antenna; and
   a thermocouple having a first and a second leg of two dissimilar conductors, for detecting the electromagnetic wave received by the arms of the antenna,
   wherein the heat source and the thermocouple are made of different materials.

2. The device of claim 1, wherein the thermocouple has a junction of the first and the second leg.

3. The device of claim 2, wherein the junction is in the vicinity of the heat source.

4. The device of claim 2, further comprising an insulating layer on the heat source.

5. The device of claim 4, wherein the junction of the thermocouple is on top of the insulating layer above the heat source.

6. The device of claim 1, wherein the first and second leg of the thermocouple are in contact with each other through the heat source.

7. The device of claim 1, wherein the first and the second leg of the thermocouple are made of $p^+$ polysilicon and $n^+$ polysilicon, respectively.

8. The device of claim 1, wherein the first and the second leg of the thermocouple are made of Al and $p^+$ polysilicon, respectively.

9. The device of claim 1, wherein the first and the second leg of the thermocouple are made of Ni and aluminum, respectively.

10. The device of claim 1, wherein the heat source is a resistor, which generates thermal energy in response to the electromagnetic wave received by the arms of the antenna.

11. The device of claim 10, wherein the resistor is made on NiCr.

12. The device of claim 1, further comprising a pair of thermocouple groups each of which is connected to each of the legs of the thermocouple, wherein each thermocouple group includes one or more thermocouples connected in series and one or more junctions thereof are in the vicinity of the heat source.

13. The device of claim 1, wherein the legs of the thermocouple are formed to be so slender that an impedance of the thermocouple is 1 kiloohm.

14. An electromagnetic wave detecting device, comprising:
a dipole antenna having a pair of disjointed arms for receiving an electromagnetic wave;
a heat source connecting the arms of the dipole antenna for generating thermal energy in response to the electromagnetic wave received by the arms of the antenna;
an insulating layer formed on the heat source; and
two or more thermocouples each of which has a first and a second leg of two dissimilar conductors and a junction thereof, for detecting the electromagnetic wave received by the arms of the antenna,
wherein the thermocouples are in series and the junction of each thermocouple is on the insulating.

15. The device of claim 14, wherein the first and the second leg of the thermocouples are made of $p^+$ polysilicon and $n^+$ polysilicon, respectively.

16. The device of claim 14, wherein the first and the second leg of the thermocouples are made of $p^+$ polysilicon and Al, respectively.

17. The device of claim 14, wherein the first and the second leg of the thermocouples are made of Al and Ni, respectively.

* * * * *